United States Patent [19]

Gelbart

[11] Patent Number: 5,132,723
[45] Date of Patent: Jul. 21, 1992

[54] METHOD AND APPARATUS FOR EXPOSURE CONTROL IN LIGHT VALVES

[75] Inventor: Daniel Gelbart, Vancouver, Canada
[73] Assignee: Creo Products, Inc., Burnaby, Canada
[21] Appl. No.: 755,242
[22] Filed: Sep. 5, 1991
[51] Int. Cl.$^5$ .............................................. G03B 27/52
[52] U.S. Cl. ........................................ 355/40; 355/41; 355/67; 355/70; 355/71; 355/46
[58] Field of Search ....................... 355/67, 70, 71, 46, 355/40, 41

[56] References Cited

U.S. PATENT DOCUMENTS

| | | | |
|---|---|---|---|
| 3,926,520 | 12/1975 | Kaufman | 355/67 |
| 4,093,964 | 6/1978 | Aughton | 355/70 |
| 4,095,891 | 6/1978 | Lovering | 355/71 |
| 4,367,946 | 1/1983 | Varner | 355/71 |
| 4,639,127 | 1/1987 | Beery et al. | 355/71 |

Primary Examiner—Monroe H. Hayes

[57] ABSTRACT

A method and apparatus for exposure control of images formed by two dimensional light valves allows precise exposure control, high degree of exposure uniformity and immunity from defects in the light valve. The light valve is being imaged onto an object, for example a sheet of light sensitive material, and the image is scanned along the object either by moving the object or the image. The data to be imaged is entered into the first row of the light valve and as the image of the light valve is scanned along the object, the data in the first row is transferred to subsequent rows at a direction and rate that keeps the imaged data stationary relative to the object. By using a large number of rows the exposure of each image point on the object is the sum of many exposures, each exposure contributed by one row. The number of rows each bit of data travels is electronically controlled in order to determine the exposure generated by the data bit. To calibrate the device for a uniform exposure on the object the total exposure generated by each column is measured and the length of the column (i.e. the number of rows it contains) is electronically set to achieve equal exposure from all columns. Illumination non-uniformity across the light valve as well as defective cells are automatically compensated for by this method.

19 Claims, 2 Drawing Sheets

METHOD AND APPARATUS FOR EXPOSURE CONTROL IN LIGHT VALVES

BACKGROUND OF THE INVENTION

The invention relates to exposure systems, and more specifically to the use of two dimensional light modulators, also known as light valves, in exposure systems. When large area light valves are used it is difficult to uniformly illuminate all cells of the light valve. This will cause non-uniform exposure when the light valve is imaged onto an imaging surface. A second problem with large light valves is the high probability of defect, caused either by dirt or a defective cell. As the number of cells in the light valve increases so does the probability of having a faulty cell either during manufacturing of the light valve or due to failure during use. The present invention is particularly useful in conjunction with the exposure method disclosed in U.S. Pat. No. 5,049,901. It can be used with any form of light valve but is particularly useful with Deformable Mirror modulators, manufactured by Texas Instruments Inc (Texas). The principle of operation of the Deformable Mirror modulators is covered by U.S. Pat. No. 4,441,791.

Current use of light valves calls for defect free operation and a high degree of light uniformity. Both these requirements significantly increase the cost as well as limit the usefulness of light valves.

SUMMARY OF THE INVENTION

According to the invention in a light imaging assembly which includes a light valve having rows and columns of modulating cells, circuitry for shifting data from one row to the next, a light source, two-dimensional imaging surface and associated control circuitry for shifting the data from row to row at a rate so as to produce a stationary image relative to the imaging surface, there is provided a method of image projection. The method includes transferring the digital data to be imaged to a first row of modulating cells of said light valve and then to subsequent rows and imaging light onto the light valve in a direction such that each cell, when activated by the data, redirects incident light onto the imaging surface. Moving the imaging surface relative to incident image light from the light valve keeps the image substantially stationary relative to the imaging surface. Cells in columns of the light valve are selectively inhibited from turning on so that each column produces substantially the same exposure on the imaging surface when unmodulated by image data.

The inhibiting step includes activating each cell of the light valve individually, measuring the exposure on the imaging surface of light deflected by each of the cells to determine which cells are defective and the total exposure from each column of cells in the valve, and generating an inhibiting signal to the valve to inhibit selected cells in the column of cells.

The light valve may be an array of electrically controllable deformable mirrors.

In another aspect of the invention there is provided apparatus for imaging data onto an imaging surface which includes a two-dimensional light valve made up of a plurality of rows and columns of light modulating cells, a light source positioned so as to illuminate the light valve, and an imaging surface positioned so as to intercept light from the light valve. A lens assembly focuses light from the light source onto the valve and directs the light coming from the valve onto the imaging surface. Associated control circuitry is coupled to the light valve. Means for generating relative motion between the imaging surface and the imaging light from the light valve are provided. Means for inputting data to be imaged to the first row and then shifting it to subsequent rows of the light valve at a rate such that the image of the data pattern relative to the imaging surface is stationary overcomes the low brightness limitations of large area light sources. Means for inhibiting a selected number of cells in each of the columns of cells such that the exposure on the imaging surface from each of the columns in the absence of imaging data is substantially the same eliminates the need for uniform illumination of the light valve and makes the exposure system tolerant to defects.

Preferably the generating means is a position transducer for measuring the position of the imaging surface and a drive motor coupled to the imaging surface.

The inputting means includes a driver circuit which receives position data from the generating means and causes data to be shifted from one row to the next at a rate which maintains the image position relative to said imaging surface stationary.

The inhibiting means includes a disabling circuit coupled to the light valve control circuitry operative in response to input control data to generate an address and a disabling signal to the control circuitry which, in turn, disables a modulating cell corresponding to the address.

Advantageously, the light valve is a two dimensional array of electrically controllable deformable mirrors.

The light valve may be of the liquid crystal type while the imaging surface may be a sheet of light sensitive material. Alternatively, the imaging surface may be a printing plate, a projection screen, a printing cylinder or in liquid form.

BRIEF DESCRIPTION OF THE DRAWINGS

These and other objects of the invention will become apparent in the following description taken in connection with the drawings, in which.

DESCRIPTION OF THE PREFERRED EMBODIMENT

Figure 1A:
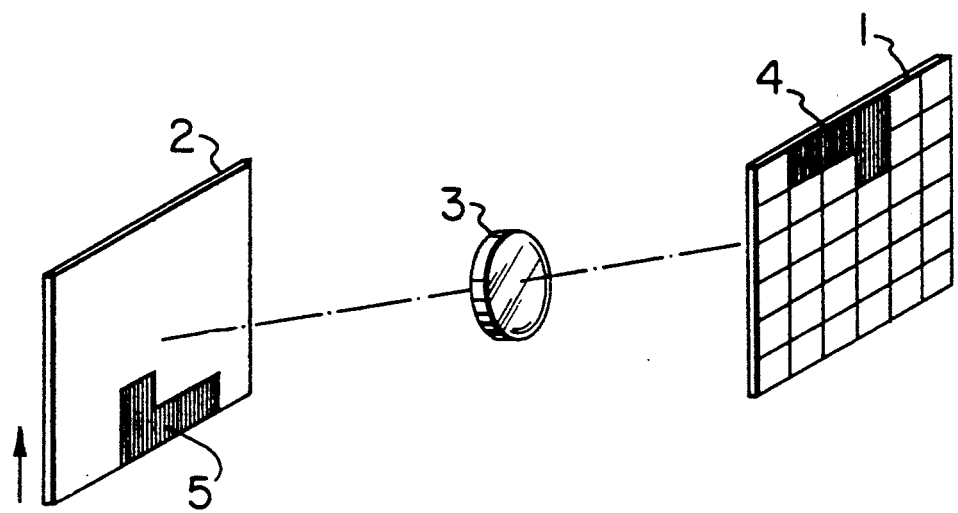
FIGS. 1a, 1b and 1c are a schematic illustration of the scanning principle used in the invention.
Figure 1B:
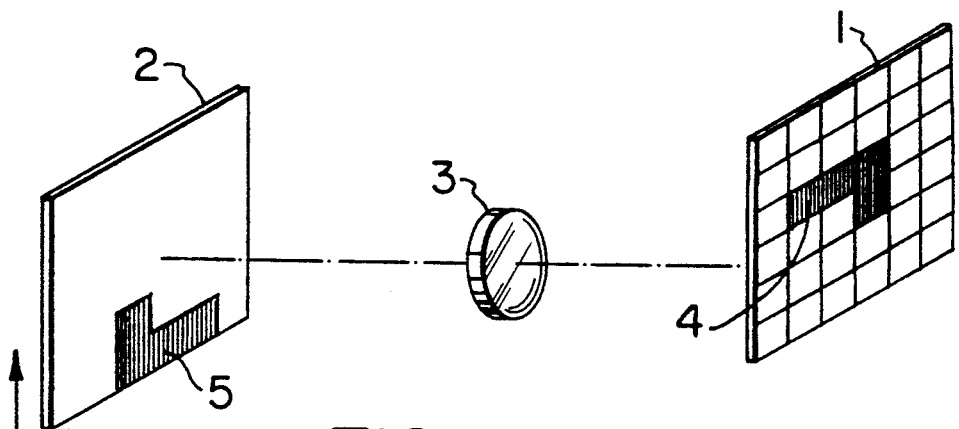
Figure 1C:
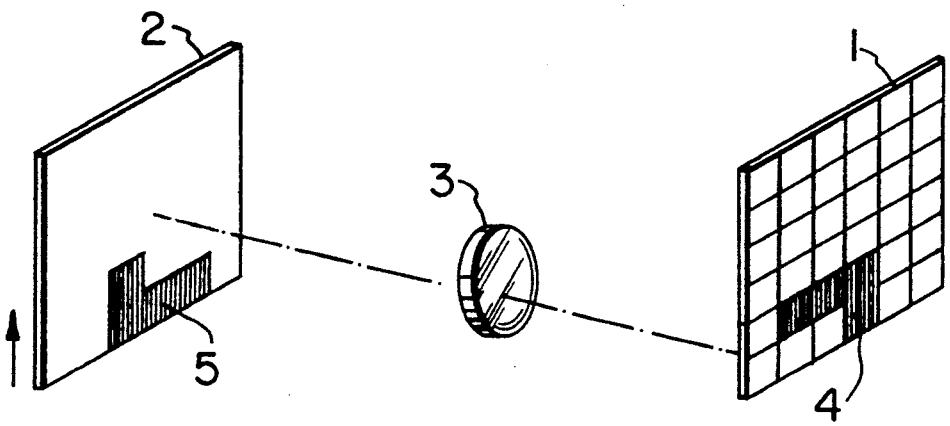

Referring to FIG. 1, a two dimensional light valve 1 is a imaged onto a sheet of light sensitive material 2 using lens 3. In the preferred embodiment light valve 1 is a deformable mirror modulator manufactured by Texas Instruments Inc. (Texas). The image data 4 is moved down the columns of the light valve 1 at a direction and rate keeping the image 5 stationary relative to the moving light sensitive material 2. A data input circuit 10 inputs data to the first row of cells in light valve 1 and thereafter causes them to shift sequentially to subsequent rows at a rate determined by control signals received from position transducer 12. Material 2 is caused to move by a motor 18 coupled thereto. Light from a lamp 20 is focused onto light valve 1 by lens 22. A disabling circuit 14 is coupled to the input of control circuit 16 which controls the activation of cells in valve 1. In response to programmed input control data, the inhibit circuit provides address information for each cell to be inhibited and the control circuit responds by deactivating each of those cells in a manner as explained below. This method of exposure is detailed in U.S. Pat. No. 5,049,901 and will not be detailed here.

Figure 2:
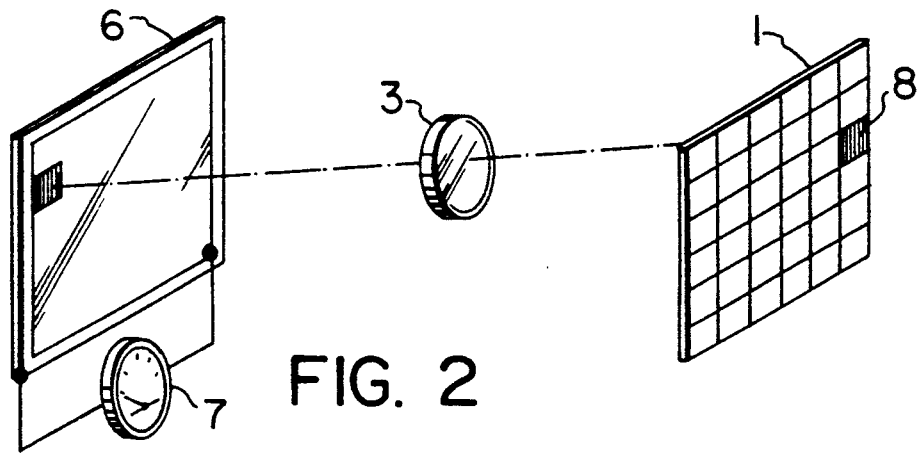
FIG. 2 is a schematic illustration of the calibration set-up.
Figure 3A:
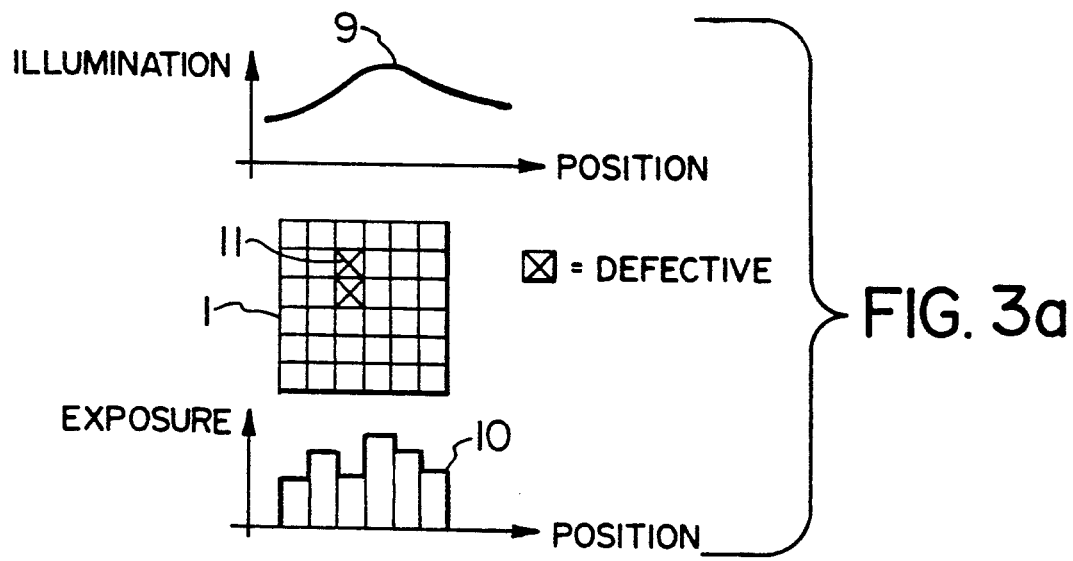
FIGS. 3a and 3b are a schematic illustration of the principle of the invention.
Figure 3B:
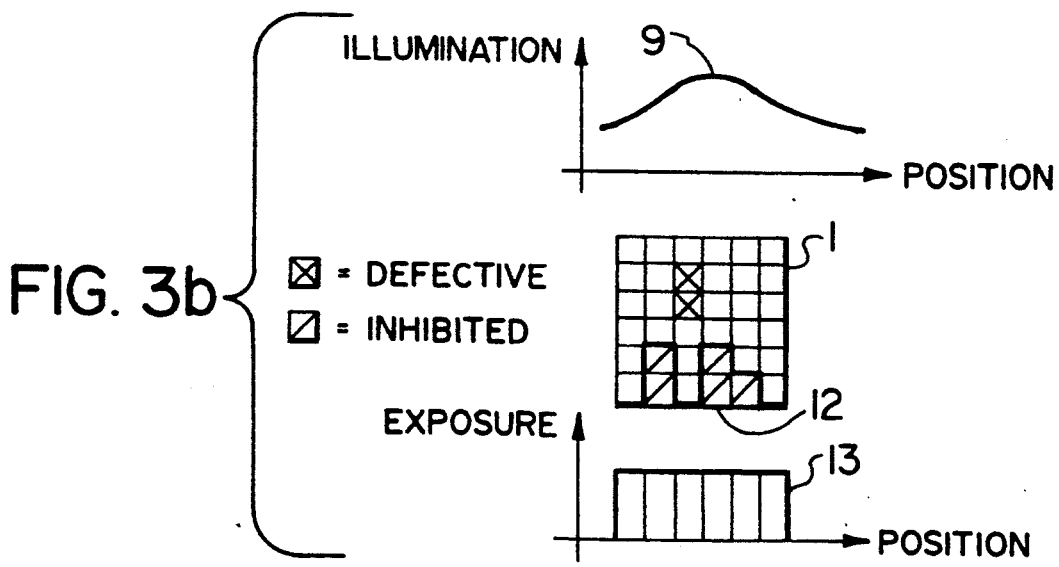

Referring now to FIG. 2, the control of the exposure requires knowing the exposure contributed by each cell in each column of the light valve. In order to measure the exposure contribution of each cell the light valve 1 is imaged on a photo-detector 6 is using imaging lens 3. The output of photodetector 6 is measured and recorded by measuring device 7. Assuming that only an activated cell 8 contributes to the exposure of detector 6, all cells of the light valve are activated, one cell at a time, and their exposure is measured and recorded. These calibration methods are common and need not be detailed here. Referring now to FIG. 3 and FIG. 1, the light valve can now be calibrated for uniform exposure (modulated by the image data, of course) across the image formed on the light sensitive material 2. By way of example, graph 9 of FIG. 3 shows a non-uniform illumination of light valve 1, typical of the illumination generated by many optical systems. Light valve 1, by way of example, has defective cells 11. The exposure on the light sensitive material 2 (in FIG. 1) resulting from using the exposure method of FIG. 1 will result in a non-uniform exposure function 10 (in FIG. 3a). Exposure is defined as the integral of the illumination over time. Since material 2 travels at a constant rate, the exposure will be the sum of the contributions of the individual cells in each column. In order to generate a uniform exposure across the image, as shown by graph 13 in FIG. 3-b some of the cells in each column have to be inhibited. An inhibited cell is not allowed to be turned on by the data. The exact details of the electronic drive circuits depend on the type of light valve used. For the deformable mirror type light valve of the preferred embodiment an example of the control electronics is shown in U.S. Pat. No. 4,571,603. Since the exposure contribution of each cell in the light valve is known from the measurement procedure shown in FIG. 2, the number of cells to be inhibited can be calculated in a way that each column will have an identical exposure for each data bit travelling along the column. It is obvious that for each defective cell one more cell can be enabled to make up for the lost exposure. In FIG. 3-b the inhibited cells 12 equalize the exposure of all columns to generate a uniform exposure 13.

It is also obvious that the inhibited cells need not be located at the bottom of the columns. They can be located at any position along the column. This allows one to take out a defective row from the light valve and to compensate for it by inhibiting one cell less in each column. The ability to take out defective rows allows some redundancy in the light valves, increasing manufacturing yield and reducing costs.

What is claimed is:

1. In a light imaging assembly which includes a light valve having rows and columns of modulating cells, circuitry for shifting data from one row to the next, a light source, two-dimensional imaging surface and associated control circuitry for shifting the date from row to row at a rate so as to produce a stationary image relative to the imaging surface, a method of image projection, comprising:
   (a) transferring the digital data to be imaged to a first row of modulating cells of said light valve and then to subsequent rows;
   (b) imaging light onto said light valve in a direction such that each cell, when activated by said data, redirects incident light onto the imaging surface;
   (c) moving the imaging surface relative to incident image light from said light valve so that the image is substantially stationary relative to the imaging surface; and
   (d) selectively inhibiting cells in columns of said light valve from turning on so that each column produces a desired exposure level on said imaging surface when modulated by image data.

2. A method according to claim 1, wherein the exposure level effected by each column on said imaging surface is substantially the same.

3. A method according to claim 1, wherein said inhibiting step includes activating each cell of said valve individually, measuring the exposure on the imaging surface of light deflected by each of said cells to determine which cells are defective and the total exposure from each column of cells in said valve and generating an inhibiting signal to said valve to inhibit selected cells in said column of cells.

4. A method according to claim 1, wherein at least one cell per column is inhibited.

5. A method according to claim 1, wherein said light valve is an array of electrically controllable deformable mirrors.

6. A method according to claim 3, wherein said measuring step includes imaging light from each of said cells, in turn, onto a photodetector positioned at the location of said imaging surface and measuring the output from said photodetector for each of said cells.

7. A method according to claim 1, wherein said first row is a row of said array which produces an image on said imaging surface before any other row.

8. Apparatus for imaging data onto an imaging surface, comprising:
   (a) a two-dimensional light valve made up of a plurality of rows and columns of light modulating cells;
   (b) a light source positioned so as to illuminate said light valve;
   (c) an imaging surface positioned so as to intercept light from said light valve;
   (d) a lens assembly for focusing light from said light source onto the valve and for directing the light coming from the valve onto the imaging surface;
   (e) associated control circuitry coupled to said light valve operative in response to control signals to control activation of said cells;
   (f) means for generating relative motion between the imaging surface and the imaging light from the light valve;
   (g) means for inputting data to be imaged to the first row and then shifting it to subsequent rows of the light valve at a rate such that the image of the data pattern relative to the imaging surface is stationary; and
   (h) means for inhibiting a selected number of cells in each of said columns of cells such that the exposure on said imaging surface from each of said columns in the absence of imaging data is substantially the same.

9. Apparatus according to claim 8, wherein said generating means is a position transducer for measuring the position of the imaging surface and a drive motor coupled to said imaging surface.

10. Apparatus according to claim 8, wherein said inputting means includes a driver circuit which receives position data from the generating means and causes data to be shifted from one row to the next at a rate which maintains the image position relative to said imaging surface stationary.

11. Apparatus according to claim 8, wherein said inhibiting means includes a disabling circuit coupled to said light valve control circuitry operative in response to input control data to generate an address and a disabling signal to said control circuitry which, in turn, disables a modulating cell corresponding to the address.

12. Apparatus according to claim 8, wherein said light valve is a two dimensional array of electrically controllable deformable mirrors.

13. Apparatus according to claim 8, wherein said light valve is of the liquid crystal type.

14. Apparatus according to claim 8, wherein said imaging surface is a sheet of light sensitive material.

15. Apparatus according to claim 8, wherein said imaging surface is a printing plate.

16. Apparatus according to claim 8, wherein said imaging surface is a projection screen.

17. Apparatus according to claim 8, wherein said imaging surface is in liquid form.

18. Apparatus according to claim 8, wherein said imaging surface is a printing cylinder.

19. Apparatus according to claim 8 including a photodetector for measuring each cell output on the imaging surface.

* * * * *